United States Patent
Cattaneo et al.

(10) Patent No.: US 8,029,597 B2
(45) Date of Patent: Oct. 4, 2011

(54) USE OF MAGNESIUM-COPPER COMPOSITIONS FOR THE EVAPORATION OF MAGNESIUM AND MAGNESIUM DISPENSERS

(75) Inventors: Lorena Cattaneo, Busto Arsizio (IT); Antonio Bonucci, Milan (IT); Simona Pirola, Carugate (IT); Alessandro Gallitognotta, Origgio (IT)

(73) Assignee: Saes Getters S.p.A., Lainate MI (IT)

( * ) Notice: Subject to any disclaimer, the term of this patent is extended or adjusted under 35 U.S.C. 154(b) by 435 days.

(21) Appl. No.: 12/282,758

(22) PCT Filed: Mar. 12, 2007

(86) PCT No.: PCT/IT2007/000181
§ 371 (c)(1),
(2), (4) Date: Feb. 26, 2009

(87) PCT Pub. No.: WO2007/105252
PCT Pub. Date: Sep. 20, 2007

(65) Prior Publication Data
US 2009/0266201 A1     Oct. 29, 2009

(30) Foreign Application Priority Data
Mar. 13, 2006   (IT) .............................. MI2006A0444

(51) Int. Cl.
C22B 26/22    (2006.01)
C23C 14/26    (2006.01)
C22C 9/00     (2006.01)

(52) U.S. Cl. .................. 75/595; 252/181.6; 420/494

(58) Field of Classification Search .................. 75/367, 75/10.33, 409, 590, 595, 607; 148/432, 442; 252/181.1, 181.2, 181.6; 313/564; 420/494, 420/587; 445/9
See application file for complete search history.

(56) References Cited

U.S. PATENT DOCUMENTS

| | | | |
|---|---|---|---|
| 3,578,834 | A | 5/1971 | Porta et al. |
| 3,579,459 | A | 5/1971 | Porta et al. |
| 3,598,384 | A | 8/1971 | Zucchinelli |
| 3,636,302 | A | 1/1972 | Porta et al. |
| 3,663,121 | A | 5/1972 | Porta et al. |
| 4,233,936 | A | 11/1980 | Longsderff et al. |
| 6,013,384 | A | 1/2000 | Kido et al. |
| 6,255,774 | B1 | 7/2001 | Pichler |
| 6,770,502 | B2 | 8/2004 | Cok et al. |

FOREIGN PATENT DOCUMENTS

| | | |
|---|---|---|
| EP | 1 422 281 A1 | 5/2004 |
| EP | 1 684 550 A1 | 7/2006 |
| EP | 1 731 584 A1 | 12/2006 |
| JP | 47-44415 B | 11/1972 |
| WO | 02/093664 A2 | 11/2002 |
| WO | 2005/111260 A1 | 11/2005 |
| WO | 2006/057021 A1 | 6/2006 |

OTHER PUBLICATIONS

G. Gu, etal., "Transparent stacked organic light emitting devices. I. Design principles and transparent compound electrodes", Journal of Applied Physics, vol. 86, No. 8, pp. 4067-4075, (1999).
Max Hansen, "Constitution of Binary Alloys", Metallurgy and Metallurgical Engineering Series, pp. 594-595, (1958).

*Primary Examiner* — George Wyszomierski
*Assistant Examiner* — Mark L Shevin
(74) *Attorney, Agent, or Firm* — Panitch Schwarze Belisario & Nadel LLP

(57) ABSTRACT

Magnesium-copper compositions are used for the evaporation of magnesium and container up to 43.34% by weight magnesium.

9 Claims, 5 Drawing Sheets

US 8,029,597 B2

USE OF MAGNESIUM-COPPER COMPOSITIONS FOR THE EVAPORATION OF MAGNESIUM AND MAGNESIUM DISPENSERS

CROSS-REFERENCE TO RELATED APPLICATIONS

This application is a Section 371 of International Application No. PCT/IT2007/000181, filed Mar. 12, 2007, which was published in the English language on Sep. 20, 2007, under International Publication No. WO 2007/105252 A1 and the disclosure of which is incorporated herein by reference.

BACKGROUND OF THE INVENTION

The present invention relates to the use of magnesium-copper compositions for the evaporation of magnesium and to magnesium dispensers employing these compositions. Magnesium has recently found a new field of application in the production of OLED displays (Organic Light Emission Displays) and in the so-called "Top Emission OLEDs", which are referred to in the field as TOLEDs.

In summary, an OLED display is made of a double-layer or of a multi-layer of different organic materials, positioned between two series of electrodes being perpendicular to one another, one series being formed of cathodes and one series being formed of anodes. This assembly is accommodated in a hermetically closed container, which is provided with at least one transparent face that is the area where the image is displayed. For a detailed description of the structure and of the operation of OLED displays, reference may be made, for example, to U.S. Pat. No. 6,013,384. For the TOLED configuration, reference may be made to U.S. Pat. No. 6,770,502.

In the OLEDs, magnesium is used in alloy with silver in order to produce the cathodes, arranged as disclosed in U.S. Pat. No. 6,255,774 (although the latter refers to cathodes made from alkaline metals, lithium in particular) or in the article "Transparent stacked organic light emitting devices. I. Design principles and transparent compound electrodes" by G. Gu et al., *J. Appl. Phys.* 86, (8) 4067 (1999).

The production of deposits containing magnesium is carried out by evaporation of the magnesium and condensation thereof on the required portions of the OLED (in particular, in the cited patent co-evaporation of magnesium and silver is carried out).

Magnesium evaporation may be carried out from pure metal sources, but this exhibits some drawbacks. In fact, metallic magnesium is rather reactive towards atmospheric gases and humidity. Possible compounds formed upon exposure of magnesium to air, such as the oxide, the hydroxide or the carbonate, make the evaporation of the element less reproducible and would result in pollution of the formed deposits by oxygen and carbon. Consequently, the use of pure magnesium requires a constant treatment in a controlled atmosphere, which makes complex the operations of transporting and stocking, which are preliminary to the use of pure magnesium. Therefore, it is preferable to use magnesium not in the form of pure metal, but in the form of compositions which are stable in air at room temperature.

Japanese Patent No. JP-47-044415 discloses a system for evaporating magnesium, based on the use of magnesium and aluminum alloys, and particularly on compositions containing beta and gamma phases in the Al—Mg phase diagram. However, magnesium evaporation from these alloys is very sensitive to temperature variations and its rate is thus poorly controllable, in particular during the initial steps. In addition, chemical analyses carried out on evaporated films starting from these alloys have determined the presence of aluminum, although in small amounts, which is undesirable since it can modify the electrical characteristics of the cathodes.

International patent application publication WO 2005/111260 discloses a method for evaporating metals chosen among alkaline, alkaline-earth and lanthanide metals. The method includes in forming a compound of these metals which is stable at room temperature, introducing powders of this compound into a filiform metal container (e.g., made of steel) provided with openings for the evaporation of the alkaline, alkaline-earth or lanthanide metal, and heating the filiform system by direct flow of electric current through the metal of the container. Compounds useful to provide magnesium evaporation cited in WO 2005/111260 are magnesium-aluminum, magnesium-indium and magnesium-silver alloys.

BRIEF SUMMARY OF THE INVENTION

An object of the present invention is to provide compositions for magnesium evaporation resulting in a stable and controlled evaporation, in such a way as to be able to be employed with reproducible characteristics in industrial processes.

This and other objects are achieved according to the present invention, which in a first aspect thereof relates to magnesium evaporation of magnesium-copper compositions, containing up to 43.34% by weight of magnesium, and in particular the compounds $MgCu_2$, $Mg_2Cu$ or combinations thereof. In a second aspect thereof, the invention relates to magnesium dispensers employing these compositions.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
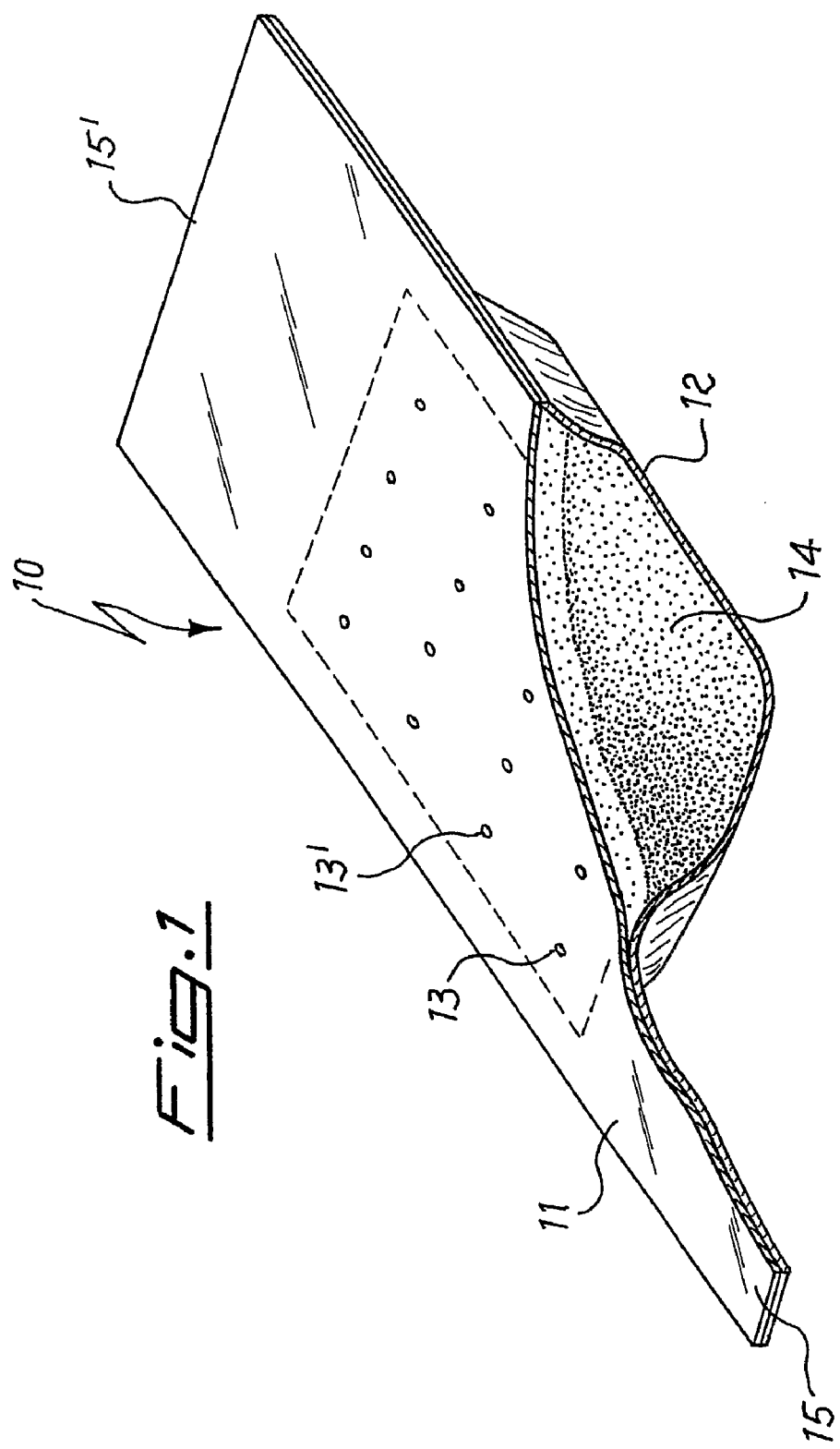
FIG. 1 is a schematic perspective view, partially broken away, of an embodiment of a magnesium dispenser of the invention.

The inventors have found that magnesium-copper compositions containing up to 43.34% by weight of magnesium are particularly suitable for use in industrial applications requiring magnesium evaporation, because they are stable at room temperature, do not sorb important amounts of gas and result in a controlled magnesium evaporation. In addition, they are easy to manufacture, have good mechanical properties, and magnesium deposits (or deposits containing magnesium) produced through evaporation of the metal from these compositions do not contain traces of copper.

The compositions for the use of the invention have a maximum magnesium content by weight equal to 43.34%, corresponding to the compound $Mg_2Cu$. Compositions being richer in magnesium could be used, but they would be formed of mechanical mixtures of this compound and metallic magnesium, and the latter component would result in the drawbacks previously described in the case of pure magnesium.

The minimum amount of magnesium in the compositions for the use of the invention is not rigidly fixed by technical considerations, but it is preferable that magnesium be present in not too low amounts, in order to have evaporation sources of the element having industrially useful yield and duration. Preferably, these compositions contain at least 10% and more preferably at least 16.05% by weight of magnesium. The latter percentage by weight corresponds to the compound MgCu2.

The compositions for the use of the invention can be easily prepared by cooling a liquid having the desired composition. As it may be determined from the magnesium-copper system phase diagram (e.g. published in *Constitution of Binary Alloys*, edited by M. Hansen, McGraw Hill, 1958) when the melt has a weight percent magnesium content exactly equal to 16.05% or 43.34%, the products of melt solidification are $MgCu_2$ and $Mg_2Cu$, respectively. In cases where the starting melt has a magnesium content lower than 16.05% by weight, the resulting solid is a mechanical mixture of $MgCu_2$ and metallic copper. Whereas, in cases where starting melt has a content of magnesium between 16.05% and 43.34% by weight, the resulting solid is a mechanical mixture of the two compounds $MgCu_2$ and $Mg_2Cu$. Any resulting composition, with either single- or double-components, is suitable for the purposes of the invention, with no need for further separation or purification steps of the components.

The ingot obtained upon solidification of the melt may be easily ground in order to obtain powders that represent the preferred physical form for use of Mg—Cu compositions for the manufacturing of magnesium dispensers, which are the second aspect of the invention.

The magnesium dispensers of the present invention are comprised of a container, which exhibits at least a portion of the walls with apertures or porosities to enable the outflow of magnesium vapors, inside which the desired Mg—Cu composition is present.

The container may be made of any material and shape being compatible with the application.

In particular, as to the material of the container, it must be chemically inert with respect to the working atmosphere and to the Mg—Cu composition throughout the whole range of temperatures prescribed for the use, generally between room temperature and about 1000° C. In the same temperature range, the material forming the container must not be subject to substantial physical alterations which modify its mechanical resistance or its shape (apart from thermal expansions), and must release as small amounts of gases as possible in operation. Materials having with such features are, for example, metals or metal alloys, some ceramics or graphite. The use of metals is preferred due to their easier capability of being worked and shaped. Another advantage in the use of these materials is that the dispenser may be heated to the evaporation temperature of magnesium by merely flowing electric current in the container walls or by induction through radiofrequencies. It is also possible to use a composite container, comprising a crucible made of ceramic material inserted in a metallic heater of corresponding shape and to assure a close contact between the two. Preferred metals and alloys for the realization of the container are molybdenum, tantalum, tungsten, nickel, steel and nickel-chrome alloys.

The shape of the container may be any one of those known from U.S. Pat. No. 3,578,834; U.S. Pat. No. 3,579,459; U.S. Pat. No. 3,598,384; U.S. Pat. No. 3,636,302; U.S. Pat. No. 3,663,121 and U.S. Pat. No. 4,233,936 or from International patent application publication WO 02/093664. Containers of various shapes and materials are also commercial available, e.g., from the Austrian Company Plansee SE of Rette (Austria), the US Company Midwest Tungsten Service of Willowbrook, Ill. (USA) or from R. D. Mathis Company of Long Beach, Calif. (USA).

A preferred shape of dispenser according to the invention is represented in FIG. 1. The dispenser 10 is comprised of a container inside which the composition of the invention is present. The container is formed by joining an upper portion 11 and a lower portion 12. The two portions are preferably made of metal, and joined to each other, for example, by means of spot welding. The lower portion is provided with a cavity in its central area (e.g. obtained by cold pressing), inside which a composition of the invention is accommodated, whereas the upper portion is provided with a plurality of apertures 13, 13', . . . for the outflow of magnesium vapors. In FIG. 1, the rectangular area delimited by the broken lines corresponds to the cavity of portion 12. The mixture of the invention may be present in the cavity of portion 12 in form of powders, as shown in the drawing, wherein the composition is illustrated as element 14. Alternatively it is possible, starting from the powders, to form pills and fill the cavity with these. The dispenser 10 is provided with two extended ends 15 and 15' that are particularly adapted for the connection to electrical power terminals for heating the dispenser by direct flow of current.

Figure 2:
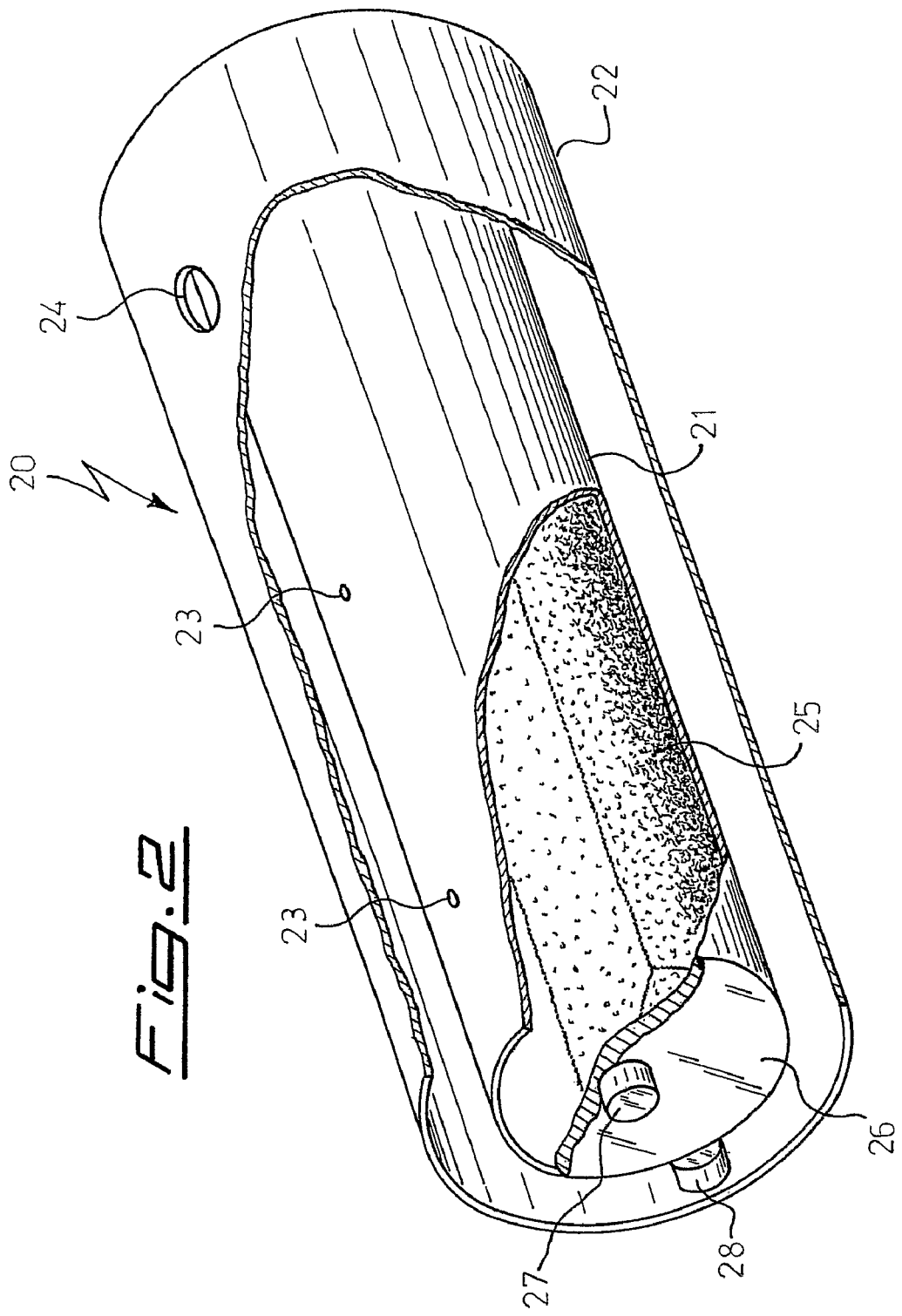
FIG. 2 is a schematic perspective view, partially broken away, of another embodiment of a magnesium dispenser of the invention.

Another preferred embodiment of magnesium dispenser, particularly for use when it is desired that the dispenser be able to release large amounts of the metal, is disclosed in International patent application publication WO 2006/057021 in the applicant's name. This dispenser is shown in a broken view in FIG. 2 and it is formed of a container and a shield, coaxial and having a cylindrical shape. The dispenser 20 is comprised of container 21 and shield 22. The container 21 is provided with apertures 23 (the dispenser of FIG. 2 has three apertures, one of which is hidden by shield 22, but the container could be provided with one, two or more than three apertures). The shield 22 is provided with apertures 24 (only one shown) in correspondence to apertures 23 on the container. In the drawing, apertures 23 and 24 are illustrated as having a circular shape, but they could also have other shapes, e.g. elongated slits. Inside the container the magnesium-copper composition 25 is provided, shown in the form of loose powders (but it could be in the form of pills). The container 21 is closed at the ends by lateral walls 26, which may be welded to the main cylindrical wall, or be in the form of "caps" inserted in the cylindrical wall. On these lateral walls 26, elements 27 are generally provided (illustrated in FIG. 2 as simple protrusions of the wall) for the connection to electrical power supply terminals (not shown). The container 21 and the shield 22 are kept at a desired distance by means of thermally insulating spacers 28, generally ceramic, for example three for each end of the system and arranged in an axial symmetry at 120° from each other (only one of these spacers is shown in FIG. 2). Finally, the shield, in turn, may have or be connected to lateral walls (not shown in the drawing), which are not in contact with the container, elements 27 or electrical feedthroughs (not shown as well), but arriving as close as possible to these. The lateral walls have the purpose of preventing the leakage of relevant amounts of magnesium vapors from the dispenser sides, but at the same time must not be in contact with (or fixed to) the inner container or the electrical feedthroughs in order to enable the free mutual movement of the latter parts in the event of possible thermal expansions.

The powders of Mg—Cu composition, either used in loose form or in the form of pellets, generally have a grain size less than 1 mm and preferably less than 500 µm. Even more preferably the grain size is between about 10 and 128 µm. Powders having a grain size less than 10 µm are generally difficult to treat during manufacturing and to hold within the dispenser.

The invention will be further illustrated by the following examples.

Example 1

A composition for the use according to the invention is prepared by introducing a mixture comprised of 19.8 g of magnesium chips and 30.2 g of copper powder into a crucible of alumina, inserting the crucible into an induction oven under an atmosphere of argon at 600 hectoPascal (hPa), heating the oven until the melting of the mixture occurs (the resulting melt is observed through a window of the oven), maintaining the oven at this temperature for 5 minutes, letting the melt cool to room temperature and finally grinding the obtained ingot in a squeeze-type mill. The powder so obtained is sieved, recovering the fraction having a grain size lower than 128 µm. The content of magnesium of this powder is equal to 39.6% by weight. 15.8 g of powder of this fraction are introduced into a dispenser of the type shown in FIG. 2, having a container with an external diameter of 28.4 mm, a length of 10 cm and two circular holes (apertures 23 in FIG. 2), and a shield having an inner diameter of 36 mm and a length of 10 cm. Both the container and the shield are made of AISI 304 L steel. The dispenser so arranged is inserted into a vacuum-tight test chamber, provided with feedthroughs for the electrical supply of the dispenser (by means of contacts such as those 27 of FIG. 2 located on container 21) and with one aperture for the connection to a vacuum system. Inside the chamber a sample carrier is also provided, located above the magnesium dispenser at a distance of 36 cm from the dispenser. Proximate to the sample carrier is a quartz crystal microbalance (QCM) which is used in the art in order to measure the growth rate of thin films by utilizing the variation of vibration frequency of the crystal as a function of the weight of material deposited thereon. The QCM is connected to the power supply system of the dispenser via a computer in order to automatically adjust the current supplied to the system and thus its temperature, depending on the desired deposition rate of magnesium.

On the sample carrier a quartz glass having a square shape with a surface of about 30 cm² is fixed, oriented so that one face thereof is arranged directly above the dispenser and perpendicular to the direction joining the latter to the glass. The chamber is evacuated and when the pressure reaches the value of $10^{-6}$ hPa, the magnesium evaporation test is started by heating the container by current passage and setting the computer controlling the power supply system in order to have a growth rate of the magnesium deposit equal to 0.3 Å per second (Å/s). The test is interrupted after 25 hours.

Figure 3:
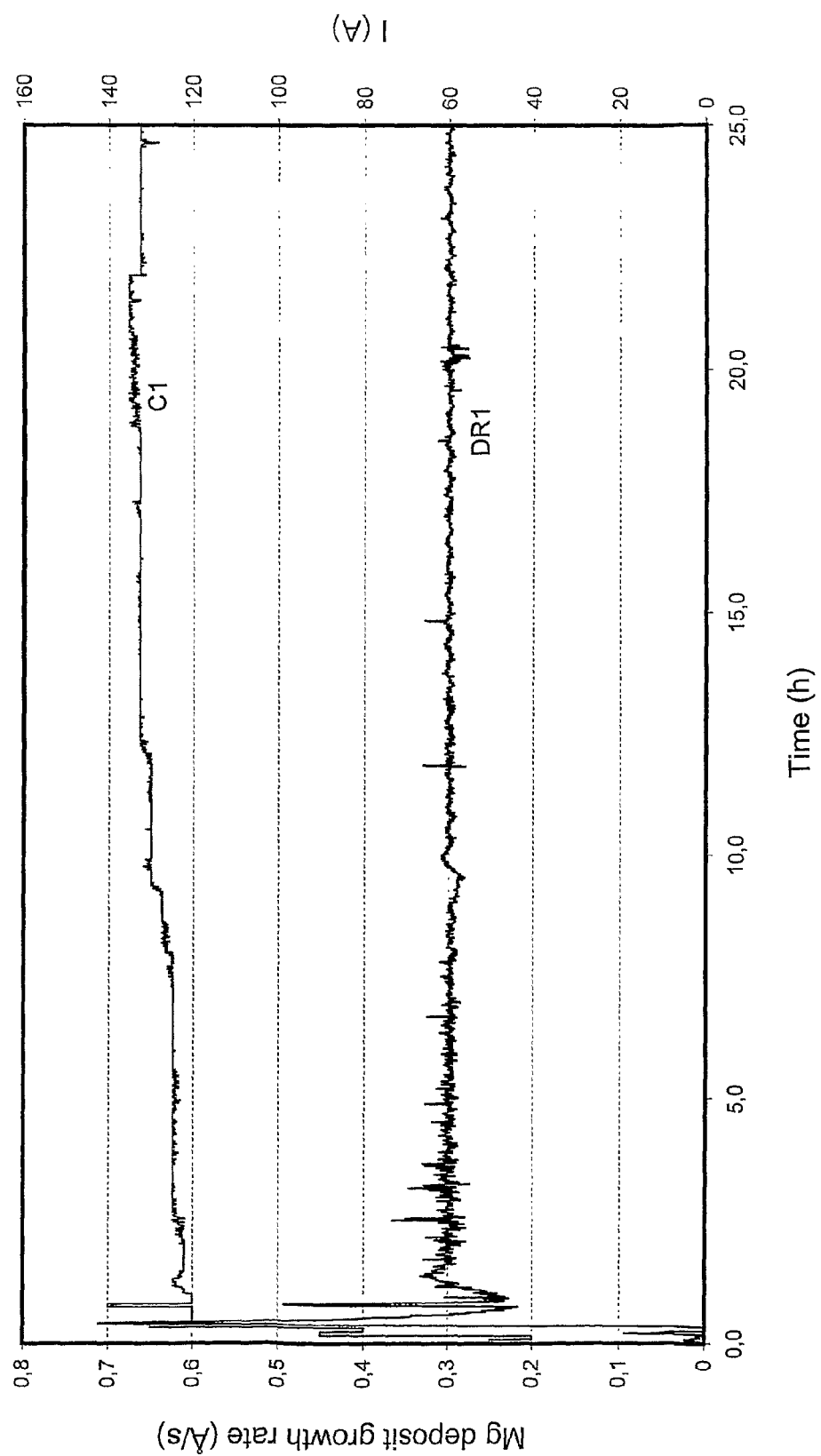
FIG. 3 is a graph representing the evaporation characteristics of magnesium from a composition used according to an embodiment of the invention.

The results of this test are shown in FIG. 3. In particular, curve DR1 relates to the growth rate of the magnesium deposit measured in ÅA/s (the scale is set forth on the vertical axis on the left of the drawing), while curve C1 relates to the trend of the current value during the test, measured in ampere (the scale is set forth on the vertical axis on the right of the drawing).

At the end of the test, the deposit formed on the glass is subject to a chemical analysis via ICP, which shows only the presence of magnesium.

Example 2 (Comparative)

The test of Example 1 is repeated, but melting in this case is of a mixture formed of 41.3 g of magnesium chips and 32.4 g of aluminum powder, obtaining, after grinding, a powder of a percentage composition by weight of 56.04% magnesium and 43.96% aluminum. The dispenser is loaded with 9.06 g of this powder.

Figure 4:
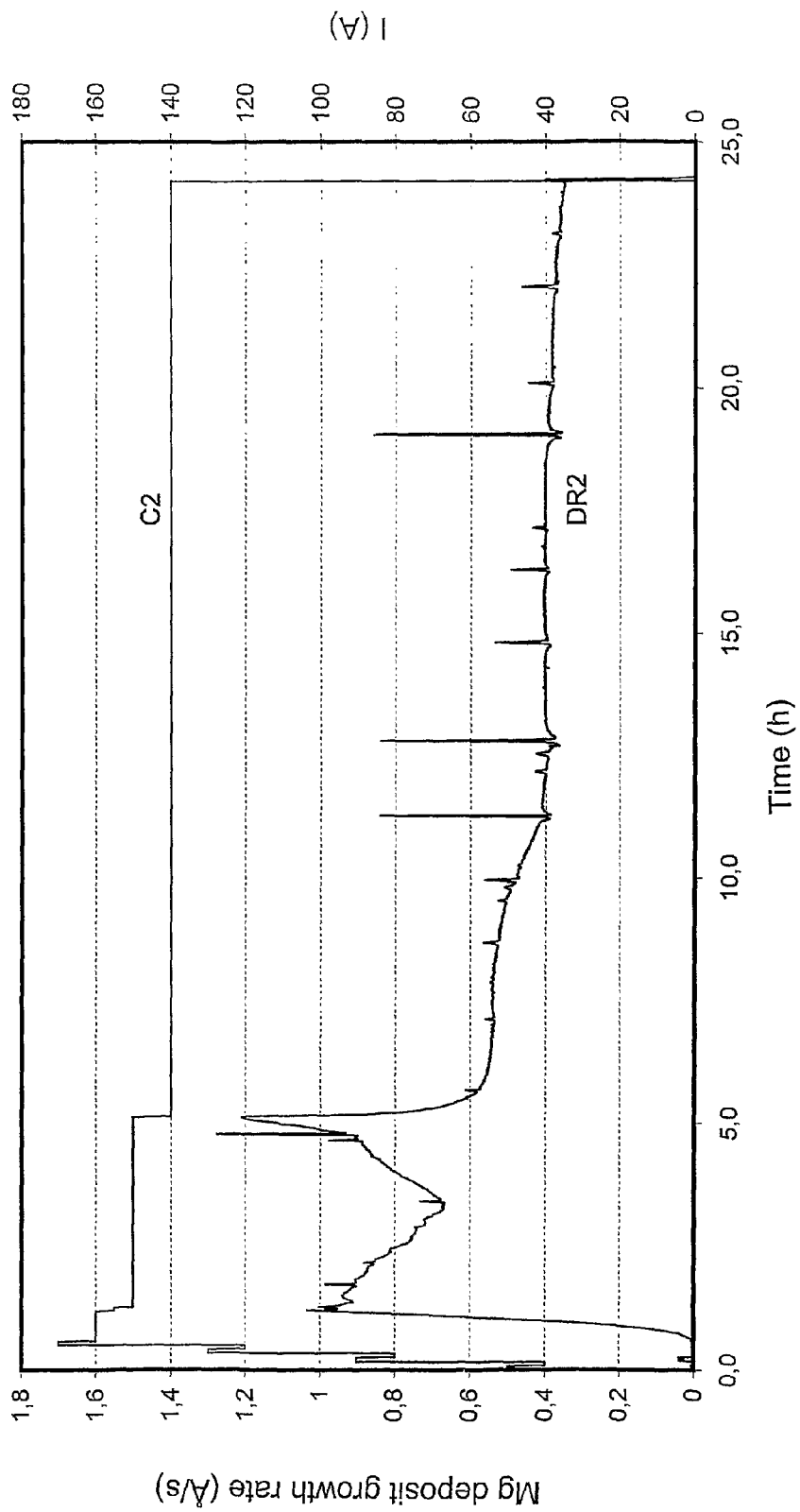
FIG. 4 is a graph representing the evaporation characteristics of magnesium from a composition of the prior art.

This dispenser is introduced into the chamber used for Example 1, with the same experimental set-up, but in this case it is not possible to have a totally automatic control of the test based on the feedback current controlled by the growth rate of the deposit due to discontinuities and frequent jumps of the growth rate. Consequently, the evaporation test is carried out by manually adjusting the supply current. Also in this case the test is interrupted after 25 hours. The results of the evaporation test are shown in FIG. 4. Curve DR2 represents the deposition rate of magnesium, while curve C2 represents the trend of the current during the test.

At the end of the test the deposit formed on the glass is subject to a chemical analysis via ICP, which shows that the deposit of magnesium contains 0.2% by weight of aluminum.

Example 3

Figure 5:
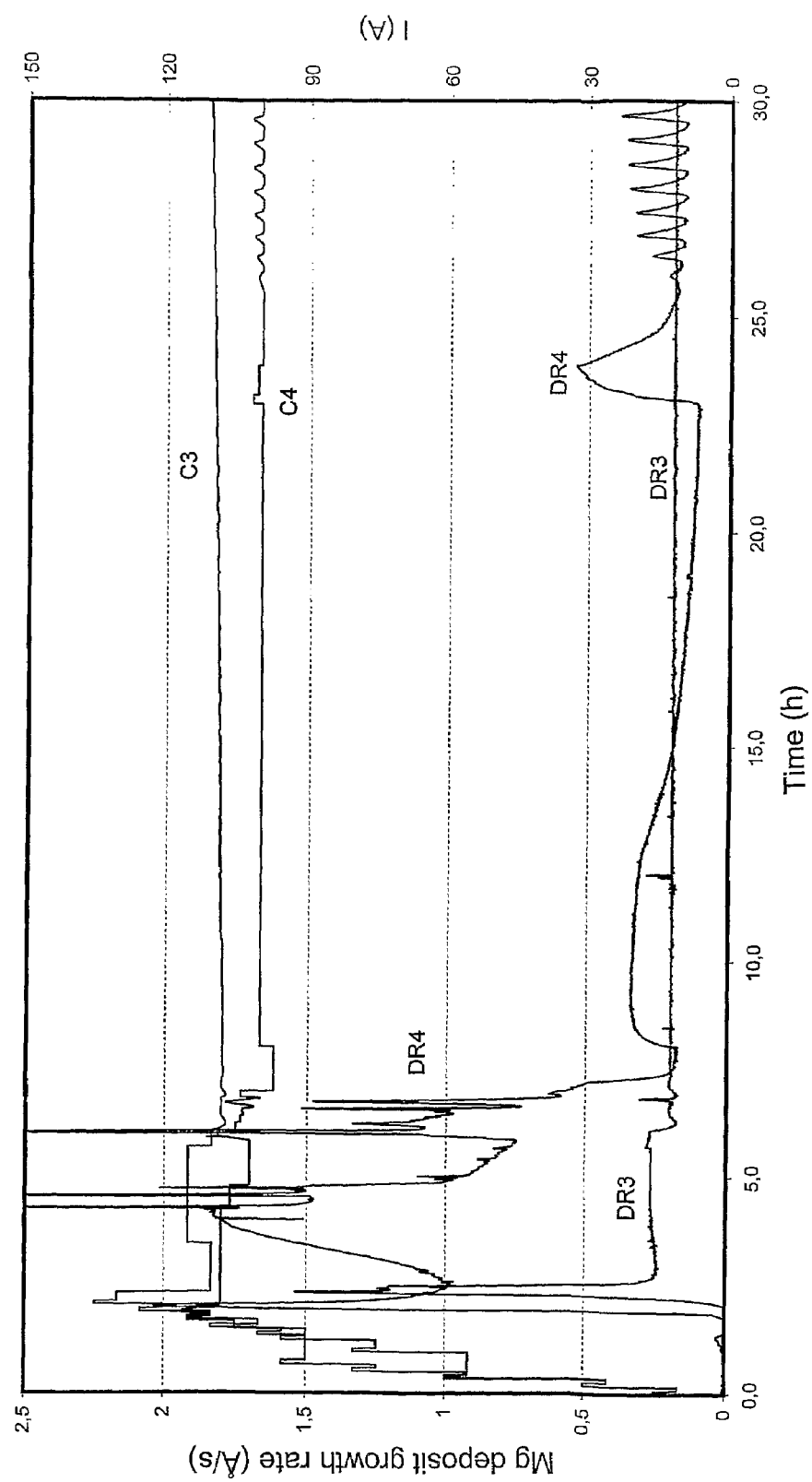
FIG. 5 is a graph showing a comparison between two other magnesium evaporation tests from one composition used according to an embodiment of the invention and one composition according to the prior art.

Another magnesium evaporation test is carried out with a composition for the use according to the invention. In this case a top-open crucible made of boron nitride is employed (C5 series number crucible inserted into a CH12 series heater of R. D. Mathis Company), containing 9 g of the same powders of Mg—Cu composition employed in Example 1. The test is carried out in the same chamber as in Example 1. The evaporation rate of magnesium is shown in FIG. 5 as curve DR3 (curve C3 shows the trend of the current during the test).

Example 4 (Comparative)

The test of Example 3 is repeated, but using 9 g of the same powders of Mg—Al composition as used in Example 2. The evaporation rate of magnesium is shown in FIG. 5, as curve DR4 (curve C4 shows the current trend during the test). Also in this case it is not possible to have a totally automatic control of the test based on the feedback current controlled by the growth rate of the deposit, due to the discontinuities and the frequent jumps of the growth rate, and the evaporation test is carried out by manually adjusting the supply current, interrupting it after 30 hours.

Discussion of the Results

As shown by curves DR1 in FIG. 3 and DR3 in FIG. 5, after an initial transient of about one hour required by the system in order to reach steady operation conditions, a magnesium-copper composition permits a controlled evaporation at a constant rate, thus making it possible to automatically control the evaporation at a constant growth rate of the magnesium deposit. In addition, Example 1 shows that the resulting deposit of magnesium is free from impurities. In contrast, curves DR2 in FIG. 4 and DR4 in FIG. 5 show that in the case of a magnesium-aluminum composition of the prior art, the evaporation characteristics are less controlled and do not enable the process automation as a function of a predefined growth rate of the metal deposit. Example 2 also shows that the same deposit is less pure since it contains traces of aluminum.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. Method of evaporation of magnesium, comprising evaporation of magnesium from a magnesium-copper composition, wherein the composition contains up to 43.34% by weight of magnesium.

2. The method according to claim 1, wherein the composition contains at least 10% by weight of magnesium.

3. The method according to claim 2, wherein the composition comprises the compound $Mg_2Cu$.

4. The method according to claim 2, wherein the composition comprises the compound $MgCu_2$.

5. The method according to claim 1, wherein the composition has a form of a powder.

6. The method according to claim 5, wherein the powder has a form of pellets.

7. The method according to claim 5, wherein the powder has a grain size of less than 1 mm.

8. The method according to claim 7, wherein the powder has a grain size of less than 500 μm.

9. The method according to claim 8, wherein the powder has a grain size between 10 and 128 μm.

* * * * *